(12) United States Patent
Kannan (10) Patent No.: US 7,530,045 B1
(45) Date of Patent: May 5, 2009

(54) RECURSIVE PARTITIONING BASED PLACEMENT FOR PROGRAMMABLE LOGIC DEVICES USING NON-RECTILINEAR DEVICE-CUTLINES

(75) Inventor: Parivallal Kannan, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 151 days.

(21) Appl. No.: 11/599,142

(22) Filed: Nov. 14, 2006

(51) Int. Cl.
G06F 17/50 (2006.01)
H03K 17/693 (2006.01)

(52) U.S. Cl. .................. 716/16; 716/7; 716/8; 716/12

(58) Field of Classification Search ............ 716/7, 716/8, 12–17; 703/13, 19
See application file for complete search history.

(56) References Cited

U.S. PATENT DOCUMENTS

| | | | |
|---|---|---|---|
| 6,463,575 B1 * | 10/2002 | Takahashi | 716/10 |
| 6,516,455 B1 * | 2/2003 | Teig et al. | 716/7 |
| 7,143,383 B1 * | 11/2006 | Teig et al. | 716/12 |
| 2003/0088841 A1 * | 5/2003 | Teig et al. | 716/8 |
| 2008/0005711 A1 * | 1/2008 | Scheffer | 716/7 |

OTHER PUBLICATIONS

Alfred E. Dunlop et al.; "A Procedure for Placement of Standard-Cell VLSI Circuits"; Copyright 1985 IEEE; IEEE Transactions on Computer Aided Design, vol. CAD-4, No. 1; Jan. 1985; pp. 92-98.
C.M. Fiduccia et al.; "A Linear-Time Heuristic for Improving Network Partitions"; Copyright 1982 IEEE; 19th Design Automation Conference; paper 13.1; pp. 175-181.
B.W. Kernigham et al.; "An Efficient Heuristic Procedure to Partition Graphs"; Bell System Technical Journal; Feb. 1970; pp. 291-307.

* cited by examiner

*Primary Examiner*—Paul Dinh
*Assistant Examiner*—Nha T Nguyen
(74) *Attorney, Agent, or Firm*—Kevin T. Cuenot (57) ABSTRACT

A method of placing a circuit design on a target device can include subdividing at least a portion of the circuit design into at least a first design-partition and a second design-partition separated by a design-cutline, and subdividing at least a portion of the target device into at least a first device-partition and a second device-partition separated by a device-cutline. The method can include determining a design-cutset corresponding to a design-cutline and calculating a measure of required wire-bandwidth for the device-cutline according to the design-cutset. The length of the design-cutline can be increased according to the measure of required wire-bandwidth, thereby altering the perimeter of the first device-partition and the perimeter of the second device-partition.

13 Claims, 5 Drawing Sheets

RECURSIVE PARTITIONING BASED PLACEMENT FOR PROGRAMMABLE LOGIC DEVICES USING NON-RECTILINEAR DEVICE-CUTLINES

FIELD OF THE INVENTION

This invention relates to the field electronic circuit design and, more particularly, to the placement of a circuit design onto a target device to achieve better quality of results.

BACKGROUND

One important task in implementing a circuit design is placement. Placement refers to the process of assigning coordinate locations from an abstract grid representation of a particular target device, such as a programmable logic device (PLD), to various blocks and pins of the circuit design. The objective of placement is to assign circuit blocks to locations of the target device such that signals linking the blocks and pins can be routed to meet established design requirements relating to the number of routing resources used, power consumption, timing requirements, etc. Typically, this is one by minimizing a cost function involving these and/or other design parameters. Estimated wire length, for example, is one type of cost function which serves as a simple first order approximation for circuit attributes such as timing, area, and congestion.

Recursive partitioning, also referred to as "min-cut partitioning", is an example of a top-down placement technique. Recursive partitioning calls for dividing the circuit design and target device into a plurality of smaller partitions. Graph-based partitioning techniques can be used to subdivide the circuit design. The circuit design is recursively partitioned, or subdivided, into smaller and smaller portions until the resulting partitions fit into a unit area of the target device.

One way of partitioning a circuit design is to use a cost function that depends upon design cutset when creating design-cutlines. A design-cutline refers to the line or boundary that creates two or more partitions from a single larger partition of the circuit design. The design-cutset for a particular design-partitioning step refers to the number of wires of the circuit design that crosses the design-cutline. Typically, the cost function seeks to minimize the design-cutset when determining the design-cutline, while also attempting to maintain a balance between the area of each resulting circuit design partition. Minimizing the design-cutset, in general, correlates to the minimization of total wire length in the circuit design.

A target device, such as a field programmable gate array (FPGA), can be modeled such that a uniform distribution of pre-fabricated wires is assumed to exist throughout the device. As such, the number of wires running across a given unit area of the target device can be assumed to be constant. Conventional approaches to partitioning-based placement have focused on creating device-partitions using rectilinear device-cutlines. A device-cutline refers to the line or boundary that creates two or more device-partitions from a single larger device-partition of the target device. Portions of the target device are subdivided using straight device-cutlines, resulting in rectangular device-partitions. Thus, it can be assumed that a straight device-cutline cuts across a number of wires that is proportional to the length of the device-cutline.

A straight device-cutline generally provides minimal wire-bandwidth. Wire bandwidth refers to the number of wires of the target device that cross a given device-cutline, whether such wires are used by the circuit design or not. A higher wire-bandwidth generally is indicative of increased site availability adjacent to the device-cutline for component placement within device-partitions created by the subject device-cutline. A lower wire-bandwidth generally is indicative of limited site availability adjacent to the device-cutline for placement within the device-partitions created by the subject device-cutline.

When sites adjacent to the device-cutline are not available, components have to be placed in the interior of the device-partitions. This leads to increased lengths of wires connecting components across the subject device-cutline. Accordingly, higher wire-bandwidth implies that more connected components can be placed such that the lengths of the wires that are cut the by the device-cutline are minimized. With this in mind, the use of rectilinear device-cutlines can lead to reduced quality of results for placement solutions as the number of sites available for component placement within partitions is reduced or minimized.

It would be beneficial to provide a technique for recursive partitioning that addresses the limitations described above.

SUMMARY

The present invention provides methods and articles of manufacture relating to recursive partitioning of a circuit design and a target device as it pertains to the floorplanning and placement process. One embodiment of the present invention can include a method of placing a circuit design on a target device including subdividing at least a portion of the circuit design into at least a first design-partition and a second design-partition separated by a design-cutline and subdividing at least a portion of the target device into at least a first device-partition and a second device-partition separated by a device-cutline, which can be straight. The method can include determining a design-cutset corresponding to the design-cutline and calculating a measure of required wire-bandwidth for the device-cutline according to the design-cutset. The length of the design-cutline can be increased according to the measure of required wire-bandwidth, thereby altering a perimeter of the first device-partition and a perimeter of the second device-partition.

In one embodiment, increasing a length of the device-cutline can include selecting a first region and a second region, wherein the first region is located within the first device-partition and the second region is located within the second device-partition. The first and second regions can be defined to be of equal, or approximately equal, area (e.g., the areas of the two regions can be within a predetermined percentage of one another in area, such as ten percent). Each region can be in contact with the device-cutline. The first region can be assigned to the second device-partition and the second region can be assigned to the first device-partition. The selection and assigning of regions can be repeated until a measure of wire-bandwidth for the device-cutline is at least equal to the measure of required wire-bandwidth.

In another embodiment, increasing a length of the device-cutline can include changing the shape of the device-cutline according to a device-cutline shape selected from a plurality of device-cutline shapes. Different ones of the plurality of device-cutline shapes can have different lengths and corresponding wire-bandwidths. Each of the plurality of device-cutline shapes, if used to subdivide the target device, can produce device-partitions of approximately equal area. For example, increasing the length of the device-cutline can include changing the shape of the device-cutline to be approximately diagonal.

Another embodiment of the present invention can include a method of placing a circuit design on a target device including partitioning at least a portion of the target device using a device-cutline into a first device-partition and a second device-partition. The device-cutline can be initially straight, leaving two rectangular device-partitions. A first region and a second region can be selected. The first region can be located within the first device-partition and the second region can be located within the second device-partition. Each region can be in contact with the device-cutline. The first region can be assigned to the second device-partition and the second region can be assigned to the first device-partition. The device-cutline can be re-defined according to a portion of a perimeter of the first device-partition and a portion of a perimeter of the second device-partition that are in contact with one another.

The selecting and assigning of regions can be performed until a predetermined length of the device-cutline is achieved. The method also can include determining the predetermined length of the device-cutline according to a measure of wire-bandwidth needed to accommodate a design-cutset corresponding to a design-cutline. Selecting a first region and a second region also can include defining the first region and the second region to be of equal, or approximately equal, area.

Yet another embodiment of the present invention can include a machine readable storage, having stored thereon a computer program having a plurality of code sections for causing a machine to perform the various steps and functions described herein.

BRIEF DESCRIPTION OF THE DRAWINGS

Preferably preferred embodiments are shown in the drawings. It should be appreciated, however, that the invention is not limited to the precise arrangements and instrumentalities shown.

DETAILED DESCRIPTION OF THE INVENTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not be interpreted as limiting, but merely as a basis for the claims and as a representative basis for teaching one skilled in the art by variously employ the inventive arrangements in virtually any appropriately detailed structure. Further, the terms and phrases used herein are not intended to be limiting but rather to provide an understandable description of the invention.

The embodiments disclosed herein relate to recursive partitioning of a circuit design and a target device, such as a programmable logic device, e.g., a field programmable gate array or an application specific integrated circuit, as it pertains to the floorplanning and placement process. The embodiments disclosed herein provide an adaptive, non-rectilinear device-partitioning strategy. A target device, or portions thereof, can be partitioned using a device-cutline that is not rectilinear, or straight. Use of non-rectilinear device-cutlines in forming device-partitions on a target device provides higher wire-bandwidth than what is attainable using straight device-cutlines. Further, as compared to straight device-cutlines, non-rectilinear device-cutlines allow a larger number of connected circuit components to be placed closer to one another on the target device, such that the connections straddle the device-partitions.

The figures referenced within this specification are discussed largely in the context of an entire target device. It should be appreciated, however, that the techniques disclosed herein are also applicable to portions of a target device. For example, an already existing device-partition, or other subdivision of a target device, can be further partitioned as disclosed herein. The embodiments discussed herein can be applied in the context of a recursive partitioning technique used during the placement process.

Figure 1:
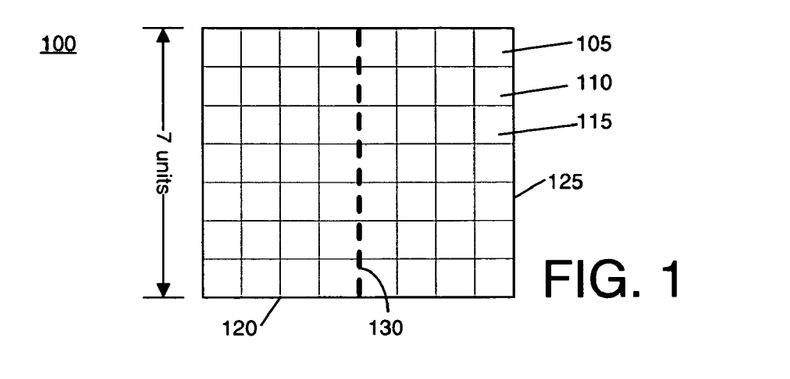
FIG. 1 is a block diagram illustrating a target device in accordance with on e embodiment of the present invention.

FIG. 1 is a block diagram illustrating a target device 100 in accordance with one embodiment of the present invention. In one embodiment, for example, the target device 100 can be implemented as a PLD such as an FPGA. As shown, the target device 100 has been subdivided into a plurality of regions, e.g., regions 105, 110, 115, etc., of approximately equivalent area. For purposes of illustration, it can be assumed that each of the regions 105, 110, and 115 has a unit length and a unit width of one.

A device-cutline 130 has been created that subdivides the target device 100 into two device-partitions 120 and 125. Each of the device-partitions 120 and 125 can be said to be rectilinear in that each is rectangular in shape. From the grid superimposed upon the target device 100, it can be seen that the device-cutline 130 has a length of 7 units. In one embodiment, the device-cutline 130 can be referred to as a "seed-cutline". The term "seed-cutline" refers to the notion that while the device-cutline 130 initially can be established as a straight line, the device-cutline 130 can be modified or re-shaped, as the case may be, to achieve a different, and larger, wire-bandwidth.

Generally, it can be assumed that prefabricated wires are uniformly distributed across the target device 100. With this in mind, the wire-bandwidth of the device-cutline 130 can be estimated based upon the known length of the device-cutline 130. The term wire-bandwidth, as used herein, refers to the number of wires of the target device that cross over a device-cutline, such as a device-cutline 130, whether such wires are used by the circuit design or not. Accordingly, the wire-bandwidth of device-cutline 130 can be proportional to its length of 7 units.

Figure 2:
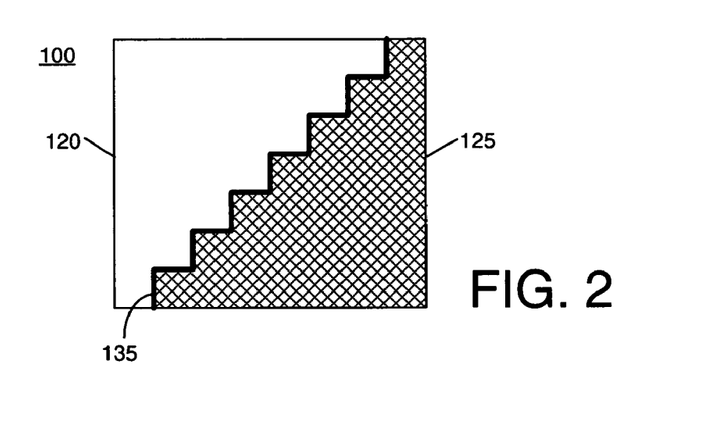
FIG. 2 is a block diagram illustrating the target device of FIG. 1 in accordance with another embodiment of the present invention.

FIG. 2 is a block diagram illustrating the target device 100 in accordance with another embodiment of the present invention. The device-cutline 130 of FIG. 1 has been changed, or reshaped, into device-cutline 135 to approximate a diagonal shape as opposed to a straight line. As a result, the shapes of device-partitions 120 and 125 of the target device 100 have changed in a manner consistent with the form, or shape, of the device-cutline 135. The shape and perimeter of each of device-partitions 120 and 125 changes with the shape of the device-cutline 135, which effectively runs along the portion of the perimeter of device-partition 120 that is in contact with the portion of the perimeter of device-partition 125, as device-cutline 135 is the dividing line between device-partitions 120 and 125.

Using the same scale as illustrated in FIG. 1, the device-cutline 135 of FIG. 2 now has a length of 13 units. This longer length provides an increased wire-bandwidth assuming a uniform distribution of prefabricated wires on the target device 100. Moreover, the longer device-cutline 135 also increases the number of circuit design components with connecting wires cut by the device-cutline 135 that can be placed adjacent to one another. Thus, device-cutline 135 cuts a greater number of wires while simultaneously allowing the cut wires to take the same length as the device-cutline 130 of FIG. 1. FIG. 2 also illustrates that the areas of device-partitions 120 and 125 remain balanced, or equal, with the reshaped device-cutline 135.

Figure 3:
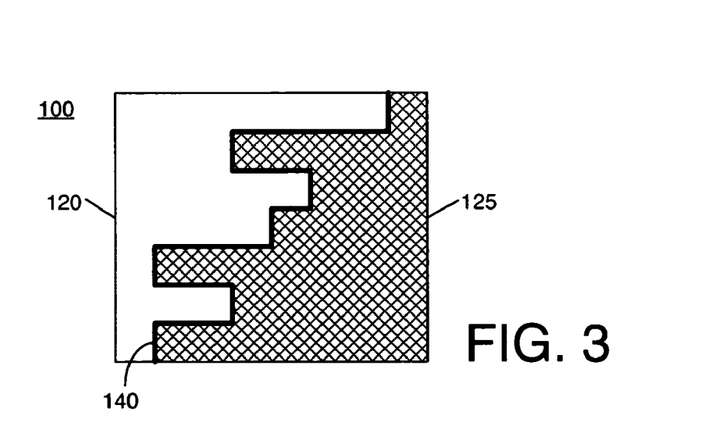
FIG. 3 is a block diagram illustrating the target device of FIG. 1 in accordance with another embodiment of the present invention.

FIG. 3 is a block diagram illustrating the target device 100 in accordance with another embodiment of the present invention. In this illustration, the device-cutline 130 of FIG. 1 has been changed, or reshaped, into device-cutline 140 to provide a length of 21 units. As such, the device-cutline 140 provides even greater wire-bandwidth that the device-cutline 135 shown in FIG. 2 as well as an increase in the number of circuit design components with connecting wires cut by the device-cutline 140 that can be placed adjacent to one another. As previously noted, the areas of device-partitions 120 and 125 remain balanced with respect to one another. Thus the device-cutline 140 can accommodate larger design-cutsets than either the device-cutline 130 or device-cutline 135, resulting in lower overall wirelength.

The various shapes of device-cutlines 130, 135, and 140 that have been illustrated with reference to FIGS. 1-3 can be achieved using any of a variety of different techniques. In one embodiment, a library of device-cutline shapes can be provided. A specific device-cutline shape can be selected according to one or more attributes including, but not limited to, the size of the device-cutset of a seed-cutline, the wire-bandwidth needed to accommodate the design-cutset, and the like. In another embodiment, the shape of a device-cutline can be determined through a dynamic process, which can be iterative in nature.

Figure 4:
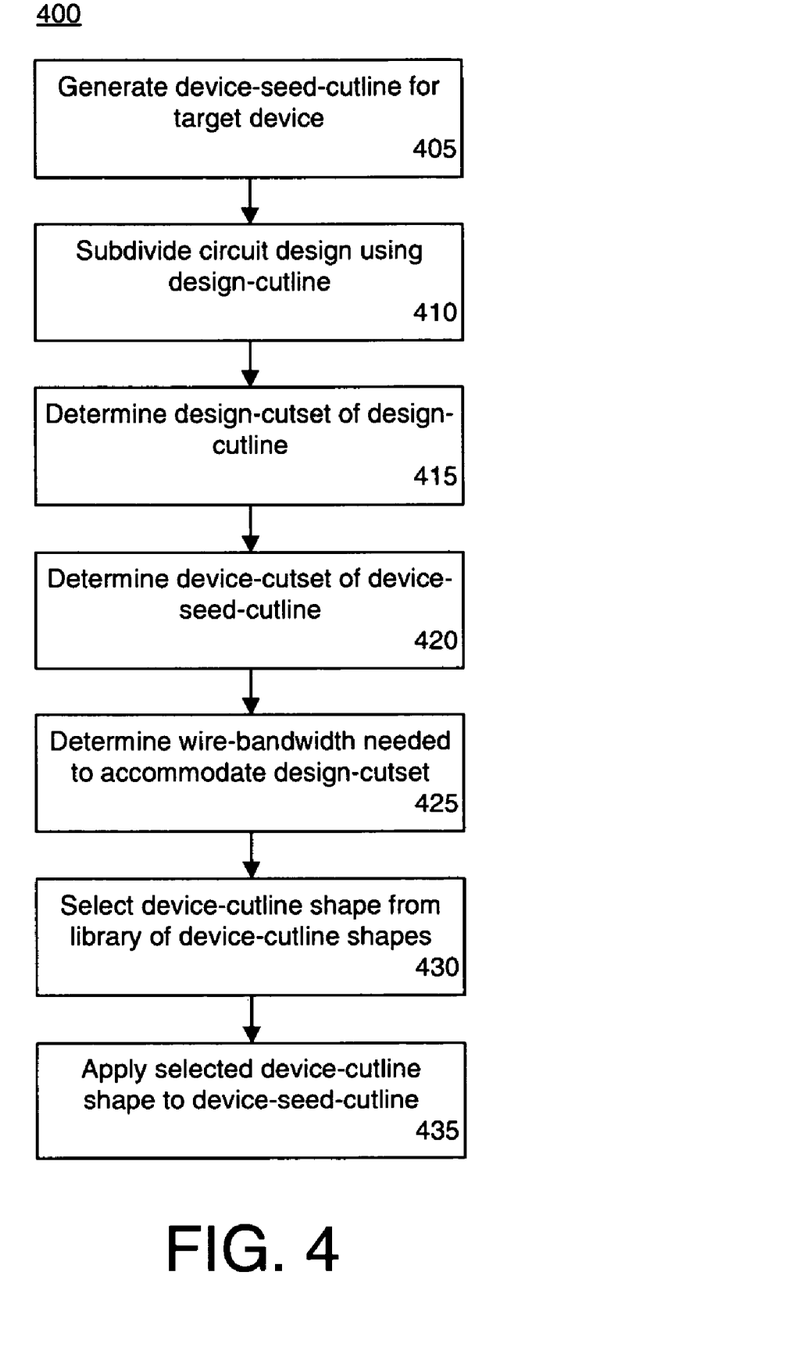
FIG. 4 is a flow chart illustrating a method of partitioning a target device in accordance with another embodiment of the present invention.

FIG. 4 is a flow chart illustrating a method 400 of partitioning a target device in accordance with another embodiment of the present invention. The method 400 can begin in a state where a circuit design is to be floorplanned or placed. As noted, though described with reference to creating first and second partitions, the embodiments disclosed herein can be applied recursively to construct partitions on a target device.

The method 400 can be gin in step 405 where the target device can be subdivided into a first and a second device-partition using a device-seed-cutline. In step 410, the circuit design can be subdivided using any of a variety of known graph-based partitioning methods. For example, possible partitioning techniques can include, but are not limited to, those described in B. W. Kernigham and S. Lin, "An Efficient Heuristic Procedure to Partition Graphs", *Bell System Technical Journal,* Pp. 291-307, (Feb. 1970), and C. M. Fiduccia and R. M. Mattheyses, "A Linear Time Heuristic for Improving Network Partitions", Proc. 19$^{th}$ Design Automation Conference, Pp. 175-181, (1982). Such techniques can optimize parameters including, but not limited to, the design-cutset, the area balance between the two design-partitions, resource balance, net criticality, and/or the like.

In step 415, the design-cutset of the design-cutline can be determined. In step 420, the device-cutset of the device-seed-cutline can be determined. In step 425, a wire-bandwidth on the target device that can accommodate the determined design-cutset can be calculated. The wire-bandwidth can be calculated according to the design-cutset using any of a variety of different heuristics. Such heuristics can provide, or indicate, a wire-bandwidth, which experience has shown to be sufficient to accommodate the determined design-cutset size. In one embodiment, the required wire-bandwidth can be determined by counting the number of wires cut by the design-cutline. In another embodiment, weights may be used to preferentially treat timing-critical wires that are cut by the design-cutline.

In step 430, a device-cutline shape can be selected from a plurality, or library, of device-cutting shapes. In one embodiment, each device-cutline shape within the library can be associated with a particular wire-bandwidth. That is, the length of a device-cutline shape can be measured in terms of standardized units and a given number of wires per standard unit. Thus, knowing the wire-bandwidth needed as determined in step 425, a device-cutline shape having at least the minimum wire-bandwidth can be selected. In step 435, the selected device-cutline shape can be applied to the device-seed-cutline. The device-seed-cutline can be reformed or modified to take on the shape of the device-cutline shape selected from the library of such shapes in step 430. The method can be repeated as may be required to further partition the target device.

In one embodiment, each of the device-cutline shapes of the library of device-cutline shapes can be formed in such a way that each device-partition formed as a result of applying such a device-cutline shape can have approximately the same area. For example, use of device-cutline shapes from the library can result in two device-partitions of the same area, of two device-partitions having areas within a predetermined percentage of one another, or of two device-partitions in which the difference between the area of each device-partition is less than a predetermined number of units, as may be determined from a grid system superimposed on the target device as shown in FIG. 1.

In another embodiment, the method discussed with reference to FIG. 4 can be extrapolated to cases in which more than two device-partitions are generated. For example, it may be the case that three device-partitions are desired, in which case two device-seed-cutlines can be created. The shape of each device-seed-cutline than can be changed by selecting a particular device-seed-cutline shape from a library of such shapes. In any case, the embodiments disclosed herein can be used to place a circuit design for physical implementation on a specified target device, e.g., to program the target device.

FIGS. 5-8 are block diagrams of a target device 500 that, when taken collectively, illustrate a method of adaptive partitioning in accordance with another embodiment of the present invention. In this embodiment, a device-cutting defining two partitions can be adaptively changed, or lengthened, to increase the wire-bandwidth of the device-cutline. Thus, the various steps illustrated with respect to FIGS. 5-8 can be repeated as may be required until the desired wire-bandwidth for the device-cutline is achieved.

Figure 5:
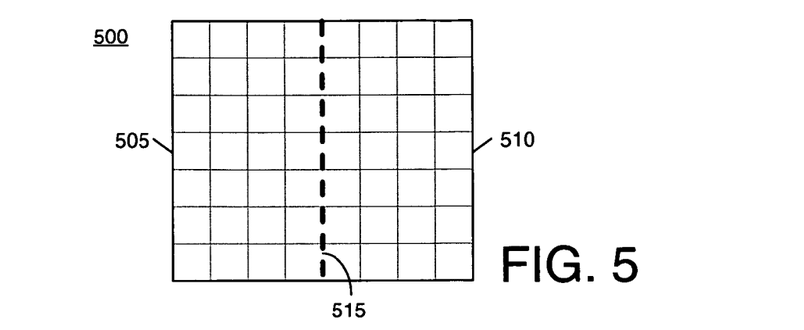
FIGS. 5-8 are block diagrams of a target device that, when taken collectively, illustrate a method of adaptive partitioning in accordance with another embodiment of the present invention.

FIG. 5 illustrates the case where the target device 500 has been initially subdivided into two device-partitions 505 and 510 by device-seed-cutline 515. At this point, device-partitions 505 and 510 are rectangular. A grid has been overlaid upon target device 500 for reference. As was the case before, the grid can indicated unit distances, such that each small block of the grid has a width of one and a height of one. Accordingly, based upon the grid, the length of device-seed-cutline 515, which is straight, is 7 units.

Figure 6:
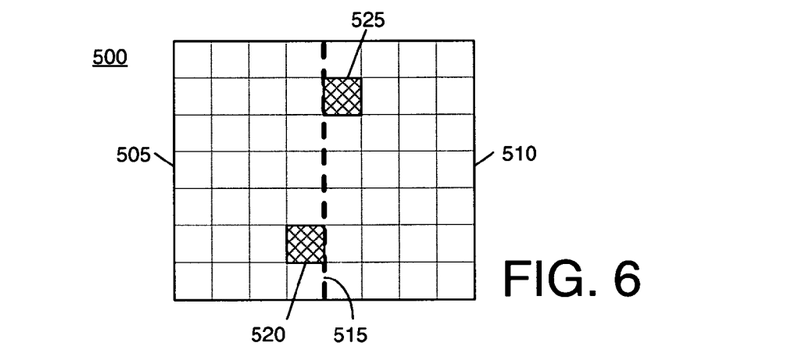

FIG. 6 illustrates that two regions 520 and 525 have been identified. In one embodiment, region 520 and region 525 can be of the same area or have areas within at least a predetermined range, or percentage, of one another. Region 520 is located within device-partition 505 and region 525 is located within device-partition 510. As shown, both regions 520 and 525 are positioned such that each is contact with the device-seed-cutline 515 on one edge. In other words, region 520 borders on the edge of device-partition 510 as defined by the device-seed-cutline 515. Similarly, region 525 borders on the edge of device-partition 505 as defined by the device-seed-cutline 515.

Figure 7:
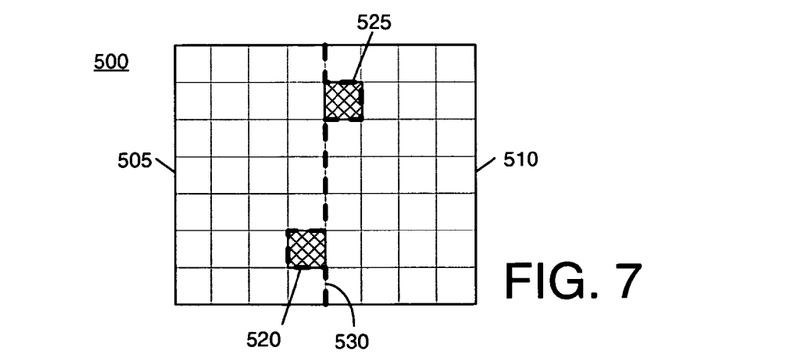
Figure 8:
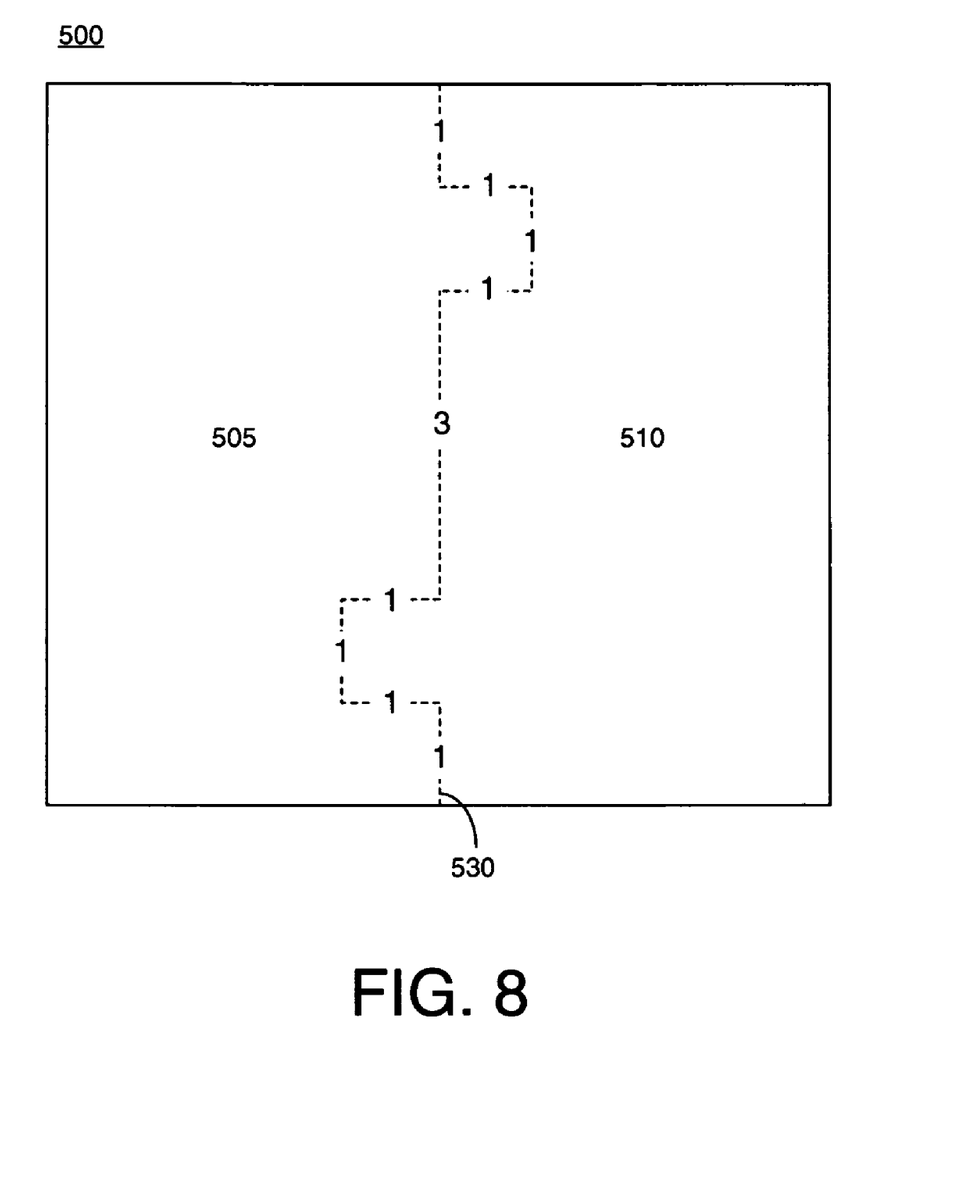

FIG. 7 illustrates that region 520 has been assigned to device-partition 510 and that region 525 has been assigned to device-partition 505. The device-seed-cutline 515 is reformed into device-cutline 530 to reflect this change as well as the resulting shapes of device-partitions 505 and 515. FIG. 8 more clearly reflects the shape of device-cutline 530. As shown, the length of the device-cutline 530 is now 11 units, thereby providing increased wired-bandwidth. Further, by effectively swapping regions of equal, or approximately equal, area, the balance in area between device-partitions 505 and 510 is maintained.

The steps shown with references to FIGS. 5-8 can be repeated to further increase the length of a device-cutline as may be required. Through each iteration, regions in each device-partition that border on the newly reformed device-cutline are selected.

Figure 9:
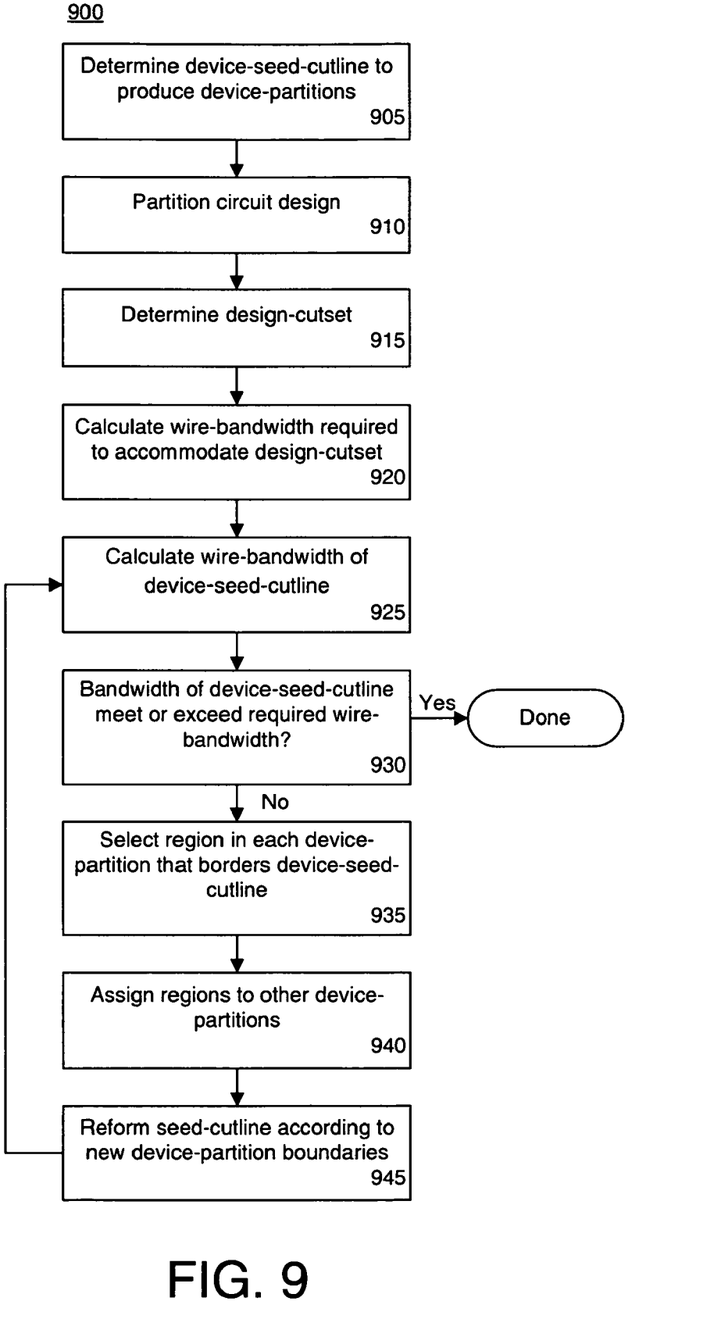
FIG. 9 is a flow chart illustrating a method of adaptive partitioning in accordance with another embodiment of the present invention.

FIG. 9 is a flow chart illustrating a method 900 of adaptive partitioning in accordance with another embodiment of the present invention. The method 900 can begin in a state where a circuit design is to be partitioned for placement upon a target device. Accordingly, in step 905, a device-seed-cutline can be determined which subdivides the target device into two portions, or initial device-partitions. In step 910, the circuit design can be partitioned using a design-cutline. The circuit design can be partitioned according to any of a variety of graph-based partitioning techniques which may account for a variety of factors including, but not limited to, design-cutset, area of each design-partition, etc.

In step 915, the design-cutset can be determined. As noted, the design-cutset refers to the number of wires of the circuit design that are cut by the design-cutline. In step 920, the wire-bandwidth needed to accommodate the design-cutset determined in step 915 can be determined. Accordingly, in step 925, the wire-bandwidth of the device-seed-cutline can be calculated. As noted, the wire-bandwidth can be calculated based upon the length of the device-seed-cutline.

In step 930, a determination can be made as to whether the wire-bandwidth of the device-seed-cutline meets or exceeds the required wire-bandwidth determined in step 920. If so, the method can end or exit. It should be appreciated that the method also can be repeated to recursively partition the circuit design and target device as may be required. If the wire-bandwidth provided by the device-seed-cutline does not meet or exceed the required wire-bandwidth, the method can continue to step 935.

In step 935, a region within each device-partition that borders on the device-seed-cutline can be selected. For example, a region A can be selected within the first device-partition and a region B within a second device-partition. As noted, the regions A and B can be of equal, or substantially equal, area. In step 940, the regions can be swapped. More particularly, region A can be assigned to the first device-partition and region B can be assigned to the second device-partition. In step 945, the device-seed-cutline can be reformed according to the newly established device-partition boundaries, i.e., the boundaries post region swap. After step 945, the method can loop back to step 925 to evaluate the wire-bandwidth for the reformed device-cutline and continue as may be required.

The embodiments disclosed herein relate to varying the length of a device-cutline used to create device-partitions for use with recursive partitioning-based placement techniques. By modifying the length of the device-cutline, the wire-bandwidth provided by the device-cutline is increased. The increase in device--cutline length coincides with alteration of the shape of the device-cutline as well as the device-partitions, resulting in non-rectilinear device-cutlines and device-partitions. Increased device-cutline length also provides increased site availability during the placement process to accommodate components that have wires cut by the device-cutline. These factors can improve the quality of result obtained using recursive partition techniques.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising, i.e., open language. The term "coupled", as used herein, is defined as connected, although not necessarily directly, and not necessarily mechanically, i.e., communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. A computer-implemented method of creating device-partitions for placing a circuit design on a target device, the method comprising:
  subdividing at least a portion of the circuit design into at least a first design-partition and a second design-partition separated by a design-cutline using a graph-based partitioning technique;
  subdividing at least a portion of the target device into at least a first device-partition and a second device-partition separated by a device-cutline, wherein the first device-partition and the second device-partition correspond to physical regions on the target device for placing the first design-partition and the second design-partition, and wherein the target device is a programmable logic device comprising a number of pre-fabricated wires per unit length;
  determining a design-cutset corresponding to the design-cutline, wherein the design-cutset specifies a number of wires that cross the design-cutline within the circuit design;
  calculating a measure of required wire-bandwidth for the design-cutline according to the design-cutset; and
  increasing a length of the device-cutline according to the measure of required wire-bandwidth, thereby altering a perimeter of the first device-partition and perimeter of the second device-partition and increasing a number of available sites along the device-cutline within the first device-partition and the second device-partition, wherein a measure of wire-bandwidth of the device-cutline is proportional to length of the device-cutline and depends upon the number of pre-fabricated wires per unit length; and wherein increasing the length of the device-cutline further comprises changing a shape of the device-cutline according to a device-cutline shape selected from a plurality of device-cutline shapes, wherein different ones of the plurality of device-cutline shapes have different lengths and corresponding wire-bandwidths.

2. The method of claim 1, wherein increasing the length of the device-cutline further comprises:
  selecting a first region and a second region of the target device, wherein the first region is located within the first device-partition and the second region is located within the second device-partition, and wherein each of the first and second regions is in contact with the device-cutline; and
  assigning the first region to the second device-partition and the second region to the first device-partition.

3. The method of claim 2, further comprising repeating the selecting and assigning unit the measure of wire-bandwidth for the device-cutline is at least equal to the measure of required wire-bandwidth.

4. The method of claim 2, wherein selecting a first region and a second region comprises defining the first region and the second region to be of equal area.

5. The method of claim 1, wherein subdividing at least a portion of the target device comprises segmenting the target device using a straight device-cutline.

6. The method of claim 1, wherein each of the plurality of device-cutline shapes, it used to subdivide the target device, produces device-partitions of approximately equal area.

7. The method of claim 1, wherein increasing the length of the device-cutline further comprises changing a shape of the device-cutline to be approximately diagonal.

8. A computer program product comprising:
  a computer readable storage having stored thereon a computer program having a plurality of code sections executable by a computer that create device-partitions for placing a circuit design, the computer readable storage comprising:
  code for subdividing at least a portion of the circuit design into at least a first design-partition and a second design-partition separated by a design-cutline using a graph-based partitioning technique;
  code for subdividing at least a portion of the target device into at least a first device-partition and a second device-partition separated by a device-cutline, wherein the first device-partition and the second device-partition correspond to physical regions on the target device for placing the first design-partition and the second design-partition, and wherein the target device is a programmable logic device comprising a number of pre-fabricated wires per unit length;
  code for determining a design-cutset corresponding to the design-cutline, wherein the design-cutset specifies a number of wires in the circuit design that cross the design-cutline within the circuit design;
  code for calculating a measure of required wire-bandwidth for the device-cutline according to the design-cutset; and
  code for increasing a length of the device-cutline according to the measure of required wire-bandwidth; thereby altering a perimeter of the first device-partition and a perimeter of the second device-partition and increasing a number of available sites along the device-cutline within the first device-partition and the second device-partition, wherein a measure of wire-bandwidth of the device-cutline is proportional to length of the device-cutline and depends upon the number of pre-fabricated wires per unit length; and wherein the code for increasing the length of the device-cutline further comprises changing a shape of the device-cutline according to a device-cutline shape selected from a plurality of device-cutline shapes, wherein different ones of the plurality of device-cutline shapes have different lengths and corresponding wire-bandwidths.

9. The computer program product of claim 8, wherein the code for increasing a length of the device-cutline comprises:
  code for selecting a first region and a second region of the target device, wherein the first region is located within the first device-partition and the second region is located within the second device-partition, wherein each of the first and second regions is in contact with the device-cutline; and
  code for assigning the first region to the second device-partition and the second region to the first device-partition.

10. The computer program product of claim 9, further comprising code for repeating execution of the code for selecting and assigning until the measure of wire-bandwidth for the device-cutline is at least equal to the measure of required wire-bandwidth.

11. The computer program product of claim 9, wherein the code for selecting a first region and a second region of the target device further comprises code for defining the first region and the second region to be of equal area.

12. The computer program product of claim 8, wherein the code for subdividing at least a portion of the target device comprises code for segmenting the target device using a straight device-cutline.

13. The computer program product of claim 8, wherein each of the plurality of device-cutline shapes, if used to subdivide the target device, produces device-partitions of approximately equal area.

* * * * *